United States Patent
He et al.

(10) Patent No.: US 12,210,256 B2
(45) Date of Patent: Jan. 28, 2025

(54) CONTROL SWITCH OF DRIVE CIRCUIT, ARRAY SUBSTRATE AND DISPLAY PANEL

(71) Applicants: MIANYANG HKC OPTOELECTRONICS TECHNOLOGY CO., LTD, Mianyang (CN); HKC CORPORATION LIMITED, Shenzhen (CN)

(72) Inventors: Zhenghang He, Mianyang (CN); Baohong Kang, Mianyang (CN)

(73) Assignees: MIANYANG HKC OPTOELECTRONICS TECHNOLOGY CO., LTD, Mianyang (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/915,502

(22) PCT Filed: Dec. 31, 2021

(86) PCT No.: PCT/CN2021/143541
§ 371 (c)(1),
(2) Date: Sep. 29, 2022

(87) PCT Pub. No.: WO2022/206077
PCT Pub. Date: Oct. 6, 2022

(65) Prior Publication Data
US 2024/0241413 A1    Jul. 18, 2024

(30) Foreign Application Priority Data
Mar. 29, 2021   (CN) .......................... 202110332575.3

(51) Int. Cl.
G02F 1/1368   (2006.01)
G02F 1/1335   (2006.01)
G02F 1/1362   (2006.01)

(52) U.S. Cl.
CPC ...... G02F 1/1368 (2013.01); G02F 1/133514 (2013.01); G02F 1/136286 (2013.01)

(58) Field of Classification Search
CPC ............. G02F 1/1368; G02F 1/133514; G02F 1/136286
See application file for complete search history.

(56) References Cited

U.S. PATENT DOCUMENTS

2009/0114968 A1   5/2009   Wang et al.
2012/0037908 A1*  2/2012   Wu ........................ H01L 33/16
                                                        257/E21.414
(Continued)

FOREIGN PATENT DOCUMENTS

CN   105140293 A   12/2015
CN   105405852 A   3/2016
(Continued)

OTHER PUBLICATIONS

Xueying Li, the ISA written comments, Mar. 2022, CN.
(Continued)

Primary Examiner — Amit Chatly

(57) ABSTRACT

A control switch of a drive circuit, an array substrate, and a display panel are disclosed. The control switch includes a thin film transistor. In the thin film transistor, each source branch directly connected to a source lead is a first source branch, and each source branch not directly connected to the source lead is a second source branch. A channel width between the first source branch and the adjacent drain branch is greater than that between the second source branch and the adjacent drain branch.

20 Claims, 6 Drawing Sheets

(56) References Cited

U.S. PATENT DOCUMENTS

| | | | | |
|---|---|---|---|---|
| 2013/0201610 A1* | 8/2013 | Yamasaki | ................ | H05K 1/18 |
| | | | | 361/679.01 |
| 2016/0232866 A1* | 8/2016 | Cho | ........................ | H03K 17/56 |
| 2018/0130887 A1 | 5/2018 | Lin et al. | | |
| 2019/0006477 A1* | 1/2019 | He | .................... | H01L 29/78696 |
| 2019/0296152 A1* | 9/2019 | Gu | .................... | H01L 29/41733 |
| 2020/0075632 A1* | 3/2020 | Long | ................. | H01L 29/41733 |

FOREIGN PATENT DOCUMENTS

| | | | |
|---|---|---|---|
| CN | 106992215 A | 7/2017 | |
| CN | 108074902 A | 5/2018 | |
| CN | 209963059 U | 1/2020 | |
| CN | 111370587 A | 7/2020 | |
| CN | 112925137 A | 6/2021 | |
| CN | 215220227 U | 12/2021 | |
| KR | 20010058179 A | 7/2001 | |
| KR | 20070026993 A | 3/2007 | |

OTHER PUBLICATIONS

Xueying Li, the International Search Report, Mar. 2022, CN.
Li, Xueying, the ISA written comments, Mar. 2022, CN.
Li, Xueying, the International Search Report, Mar. 2022, CN.

* cited by examiner

CONTROL SWITCH OF DRIVE CIRCUIT, ARRAY SUBSTRATE AND DISPLAY PANEL

CROSS-REFERENCE TO RELATED APPLICATIONS

This application is a United States national stage application of co-pending International Patent Application Number PCT/CN2021/143541, filed Dec. 31, 2021, which claims the benefit and priority of Chinese patent application number CN2021103325753, entitled "Control Switch of Drive Circuit, Array Substrate and Display Panel" and filed with China National Intellectual Property Administration on Mar. 29, 2021, the disclosure of which is hereby incorporated herein by reference in its entirety.

TECHNICAL FIELD

This application relates to the field of display technology, and more particularly relates to a control switch of a drive circuit, an array substrate, and a display panel.

BACKGROUND

The statements herein are intended for the mere purpose of providing background information related to the present application and do not necessarily constitute prior art.

Nowadays, display technology is widely used in the display of televisions, mobile phones and the display of public information. There are a variety of display panels for displaying pictures, and they can display colorful pictures. More and more display panels, such as Thin Film Transistor-Liquid Crystal Displays (TFT-LCD), Organic Light Emitting Diode (OLED) displays, etc., need to use Gate Driver on Array (GOA) technology, in which the GOA circuits are integrated onto the array substrate in the display panel to realize the scanning and driving of the display panel, so that the product costs can be reduced in terms of materials cost and manufacturing process.

Typically, when manufacturing a GOA circuit, the source, drain and source leads in a thin film transistor are disposed in the same layer and formed by etching at the same time, but the problem of uneven etching is prone to occur during the etching process. Furthermore, as the degree of integration of GOA circuits is getting increasingly higher, the distance between the source and the drain is getting smaller and smaller, so when the etching is not uniform, the source lead will be connected to both the source and the drain, resulting in a short circuit between the source and the drain.

SUMMARY

The present application provides a control switch of a drive circuit, an array substrate, and a display panel, which can prevent the occurrence of a short circuit between a source electrode and a drain electrode caused by uneven etching of the drive circuit.

In order to achieve the above objective, the present application provides a control switch of a drive circuit, the control switch including a thin film transistor. The drive circuit further includes a source lead connected to the thin film transistor. The thin film transistor includes a source electrode, a drain electrode and a gate electrode, where the source electrode includes at least two source branches arranged in parallel, and a source trunk connecting the at least two source branches. The drain electrode is arranged in the same layer as the source electrode, and includes at least one drain branch and a drain trunk connecting the at least one drain branch together. The at least one drain branch and the at least two source branches are arranged in parallel and alternately to form channels, and the gate is arranged corresponding to the source electrode and the drain electrode. The source branch directly connected to the source lead is a first source branch, and the source branch not directly connected to the source lead is a second source branch. A channel width between the first source branch and the adjacent drain branch is greater than the channel width between the second source branch and the adjacent drain branch.

The present application further discloses an array substrate that includes a drive circuit, a source lead, and a scan line driven by the drive circuit. The drive circuit includes a control switch, the control switch including a thin film transistor that is connected to the source lead. The thin film transistor includes a source electrode, a drain electrode and a gate electrode. The source electrode includes at least two source branches arranged in parallel, and a source trunk connecting the at least two source branches. The drain electrode is arranged in the same layer as the source electrode, and includes at least one drain branch and a drain trunk connecting the at least one drain branch. The at least one drain branch and the at least two source branches are arranged in parallel and alternately to form channels, and the gate is arranged corresponding to the source electrode and the drain electrode. The source branch directly connected to the source lead is a first source branch, and the source branch not directly connected to the source lead is a second source branch. A channel width between the first source branch and the adjacent drain branch is greater than the channel width between the second source branch and the adjacent drain branch.

The present application further discloses a display panel, comprising an array substrate, a color filter substrate disposed opposite to the array substrate, and a liquid crystal layer disposed between the array substrate and the color filter substrate. The array substrate includes a drive circuit, a source lead and a scan line driven by the drive circuit. The drive circuit includes a control switch, the control switch including a thin film transistor that is connected to the source lead. The thin film transistor includes a source electrode, a drain electrode and a gate electrode. The source electrode includes at least two source branches arranged in parallel, and a source trunk connecting the at least two source branches. The drain electrode is arranged in the same layer as the source electrode, and includes at least one drain branch and a drain trunk connecting the at least one drain branch. The at least one drain branch and the at least two source branches are arranged in parallel and alternately to form channels, and the gate is arranged corresponding to the source electrode and the drain electrode. The source branch directly connected to the source lead is a first source branch, and the source branch not directly connected to the source lead is a second source branch. A channel width between the first source branch and the adjacent drain branch is greater than the channel width between the second source branch and the adjacent drain branch.

Compared with the current solution in which the channel width between every two adjacent source branch and drain branch in the thin film transistor is set equal, the present application increases the channel width between the first source branch that is connected to the source lead and the adjacent drain branch in the thin film transistor. When etching the entire metal layer where the source electrode, the drain electrode and the source lead are located, if unevenness of etching occurs such that the ends of the source lead are not cleanly etched causing the end of the source lead to protrude from the first source branch, the end of the source lead still will not reach and intersect the drain so that no short circuit will be caused between the source and the drain due to the increased channel width between the first source branch and the adjacent drain branch. Such arrangement is therefore beneficial to improve the product's production yield.

BRIEF DESCRIPTION OF DRAWINGS

The accompanying drawings, which are included to provide a further understanding of the embodiments of the present application, constitute a part of the specification, are used to illustrate the embodiments of the present application, and together with the written description, serve to explain the principles of the present application. Obviously, the drawings used in the following description merely depict some embodiments of the present application, and for those having ordinary skill in the art, other drawings can also be obtained from these drawings without investing creative effort. In the drawings.

DETAILED DESCRIPTION OF EMBODIMENTS

Figure 1:
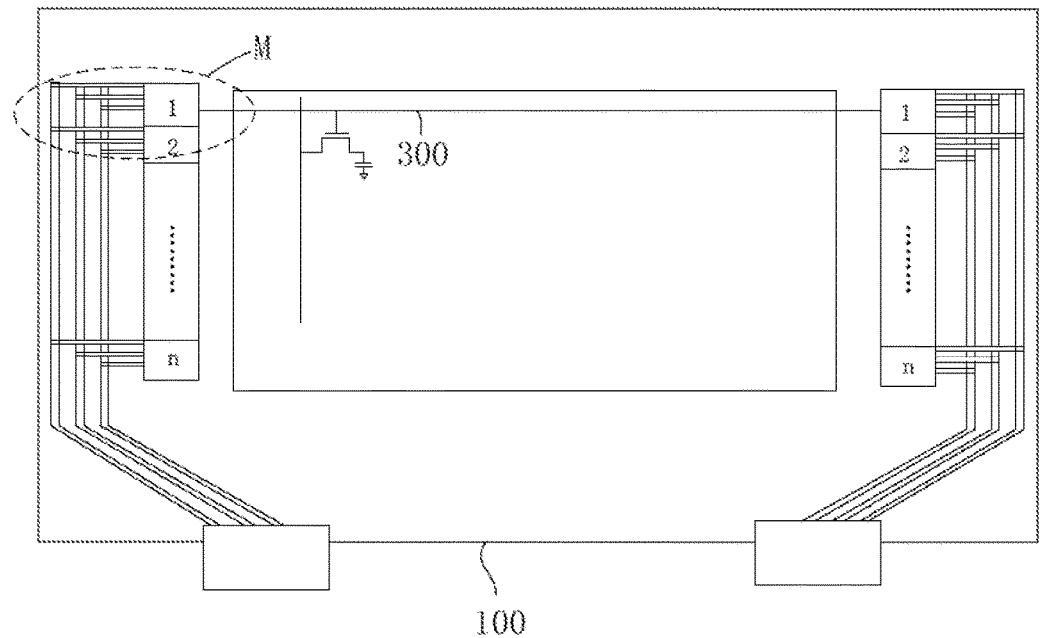
FIG. 1 is a schematic plan view of an array substrate.

It should be understood that the terminology used herein, the specific structural and functional details disclosed are intended for the mere purpose of describing specific embodiments and are representative, but the present application may be embodied in many alternative forms and should not be construed as limited only the embodiments set forth herein.

In the description of this application, the terms "first" and "second" are merely used for description purposes, and cannot be understood as indicating relative importance, or implicitly indicating the number of indicated technical features. Thus, unless otherwise specified, features defined as "first" and "second" may expressly or implicitly include one or more of the features; "plurality" means two or more. The terms "including", "comprising", and any variations thereof are intended to mean a non-exclusive inclusion, namely one or more other features, integers, steps, operations, units, components and/or combinations thereof may be present or added.

In addition, terms such as "center", "transverse", "lateral", "above", "on", "under", "below", "left", "right", "vertical", "horizontal", "top", "bottom", "inside", "outside", etc., indicative of orientations or positional relationships are described based on the orientations or relative positional relationships illustrated in the drawings, and are intended for the mere purpose of convenience of simplified description of the present application, rather than indicating that the device or element referred to must have a specific orientation or be constructed, and operate in a particular orientation. Thus, these terms should not be construed as limiting the present application.

In addition, unless otherwise expressly specified and defined, terms "installed on", "connected to", and "coupled to" should be understood in a broad sense. For example, it may be a fixed connection, a detachable connection, or an integral connection; it may be a mechanical connection, or may also be an electrical connection; it may be a direct connection, an indirect connection through an intermediate medium, or an internal connection between two components. For those having ordinary skill in the art, the specific meanings of the above terms in this application can be understood depending on specific contexts.

The present application will be described in detail below with reference to the accompanying drawings and optional embodiments. It should be noted that, should no conflict be present, the embodiments or technical features described below can be arbitrarily combined to form new embodiments.

Figure 2:
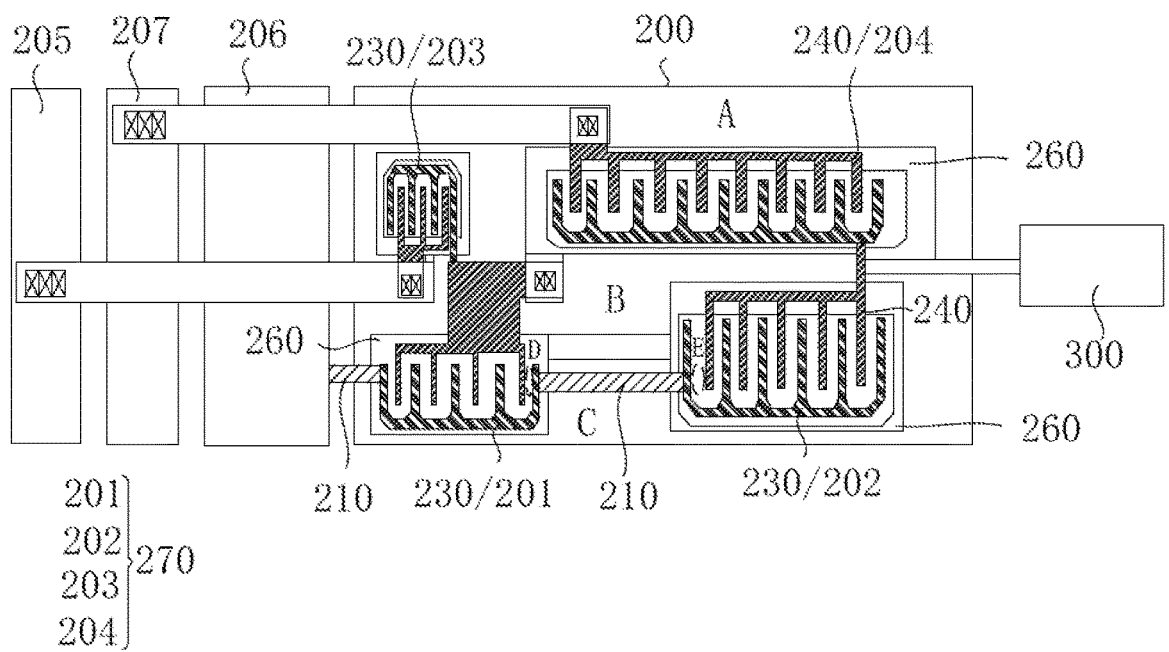
FIG. 2 is an enlarged view of portion M shown in FIG. 1.

FIGS. 1 and 2 show schematic plan views of an array substrate. A scan line 300 is disposed in a display area of the array substrate 100, and a drive circuit 200 is disposed in a non-display area of the array substrate 100, which may specifically be an array substrate gate drive circuit. The drive circuit 200 includes a frame start signal line 205, a gate voltage control line 206, a clock signal line 207 and a plurality of gate drive units 270. The input ends of the gate drive unit 270 are respectively connected to STV, VGL and CKV, and the output end of the gate drive circuit 270 is connected to the scan line 300 to drive the scan line 300.

In particular, the gate drive unit 270 includes a first thin film transistor 201, a second thin film transistor 202, a third thin film transistor 203 and a fourth thin film transistor 204. The source electrode 230 of the first thin film transistor 201 is connected to the gate voltage control line 206 and to the source electrode 230 of the second thin film transistor 202 through two source leads 210, respectively. The drain electrode 240 of the first thin film transistor 201 is connected to the source electrode 230 of the third thin film transistor 203 and to the gate electrode 260 of the fourth thin film transistor 204, and the gate electrode 260 of the first thin film transistor 201 is connected to the gate 260 of the second thin film transistor 202. The drain electrode 240 of the second thin film transistor 202 is connected to the source electrode 230 of the fourth thin film transistor 204, and the gate electrode 260 of the second thin film transistor 202 is connected to the gate electrode 260 of the fourth thin film transistor 204. The drain 240 of the third thin film transistor 203 is connected to the frame start signal line 205. The drain 240 of the fourth thin film transistor 204 is connected to the clock signal line 207.

In the gate drive unit 270 shown in FIG. 2, there are four thin film transistors connected to each other and other wirings. It can be seen in FIG. 2 that there are three blank areas, namely area A, area B and area C; between area B and area C, two thin film transistors 220 are connected through a source lead 210. Before the metal layer is etched into the source electrode 230, the drain electrode 240 and other metal line patterns, an etching stop layer needs to be formed on the source electrode 230, the drain electrode 240 and other metal line patterns, and then a developer is used to form the stop layer pattern. Since the area B and the area C are relatively large, more developer needs to be consumed, so that the developing energy consumed by the area D and the area E is reduced, and so the stop layers corresponding to the area D and the area E cannot be easily completely etched, hence the problem of uneven etching occurs when etching the metal layer pattern, resulting in the short circuit of the source electrode 230 and the drain electrode 240 at the region D and the region E.

Figure 3:
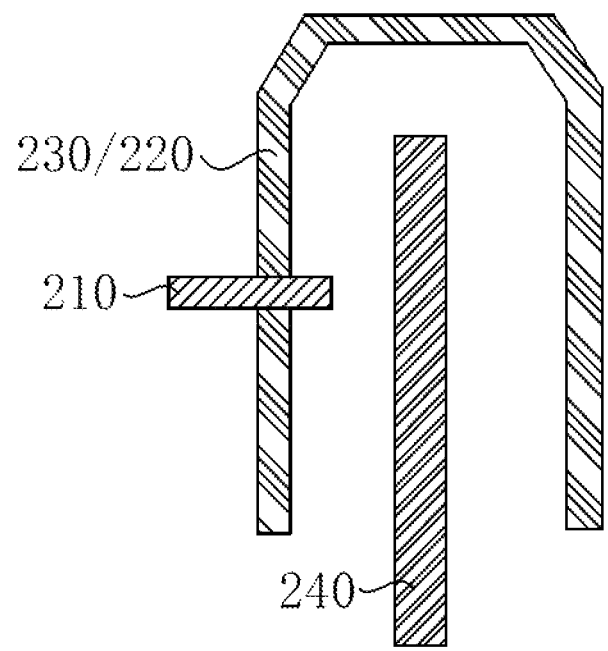
FIG. 3 is a partial schematic diagram of an exemplary gate drive unit.
Figure 4:
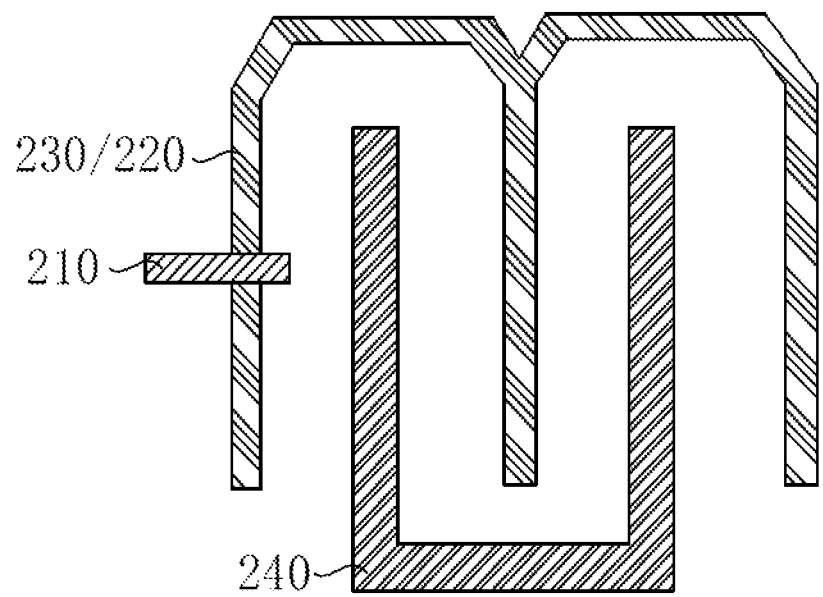
FIG. 4 is a partial schematic diagram of another exemplary gate drive unit.

FIGS. 3 and 4 show partial schematic diagrams of two exemplary GOAs. When the metal patterns corresponding to the regions D and E are not uniformly etched, the source leads 210 in FIGS. 3 and 4 will extend into the channel of the source 230 of the thin film transistor 220, or even connect with the drain electrode 240, resulting in a short circuit between the source electrode 230 and the drain electrode 240.

Figure 5:
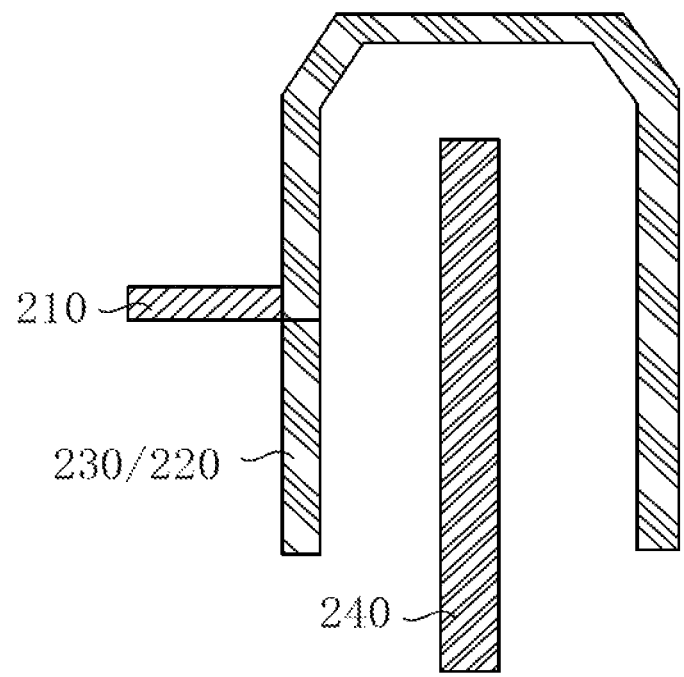
FIG. 5 is a schematic diagram based on FIG. 3 in an ideal state.
Figure 6:
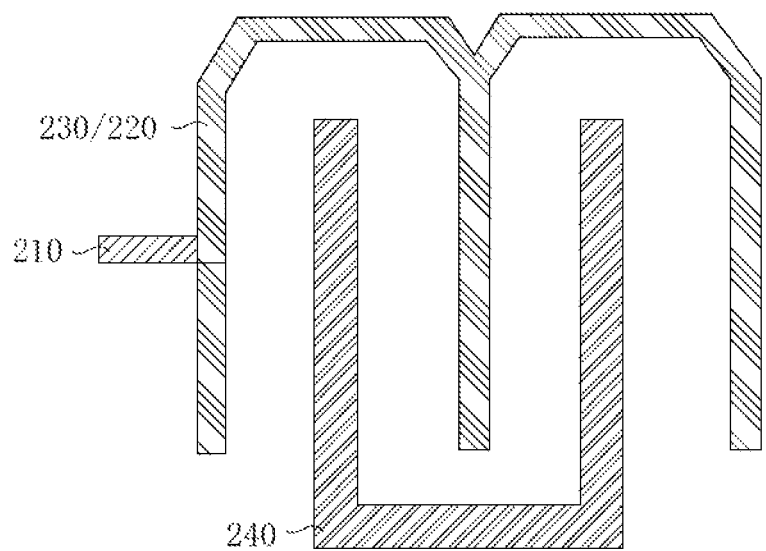
FIG. 6 is a schematic diagram based on FIG. 4 in an ideal state.

FIGS. 5 and 6 are schematic diagrams respectively based on FIGS. 3 and 4 under ideal conditions, but they needs to consume a lot of developer to ensure that the stop layers corresponding to the regions D and E are completely etched, so that when the metal pattern is subsequently etched, the source lead 210 does not protrude from the source electrode 230 and extend into the channel of the source electrode 230.

In view of this, the present application provides a control switch of a drive circuit 200 that does not cause a short circuit between the source electrode 230 and the drain electrode 240 even when the etching is uneven. As illustrated in FIGS. 1, 2, 7 to 10, the control switch includes a thin film transistor 220, and the drive circuit 200 further includes a source lead 210 connected to the thin film transistor 220. The thin film transistor 220 includes a source electrode 230, a drain electrode 240 and a gate electrode 260. The source electrode 230 includes at least two source branches 231 arranged in parallel, and a source trunk 234 connecting the at least two source branches 231. The drain electrode 240 is disposed in the same layer as the source electrode 230, and includes at least one drain branch 241, and a drain trunk 244 connecting the at least one drain branch 241 together. The at least one drain branch 241 and the at least two source branches 231 are arranged in parallel and alternately to form channels. The gate electrode 260 is arranged corresponding to the source electrode 230 and the drain electrode 240. The source branch 231 directly connected to the source lead 210 is a first source branch 232, and the source branch 231 not directly connected to the source lead 210 is a second source branch 233. A channel width between the first source branch 232 and the adjacent drain branch 241 is greater than the channel width between the second source branch 233 and the adjacent drain branch 241.

It should be noted that when there is only one drain branch 241, then the drain trunk 244 is a part of the drain branch 241 and is connected to other structures in the drive circuit 200. The gate electrode 260 may be disposed above the source electrode 230 and the drain electrode 240, or may be disposed below the source electrode 230 and the drain electrode 240.

Compared with the current solution in which the channel widths between the source branches 231 and the drain branches 241 of the thin film transistor 220 are set equal, the present application increases the width of the outer channels of the thin film transistor 220, namely the distance between the first source branch 232 and the adjacent drain branch 241. In the process of etching the metal layer where the source electrode 230, the drain electrode 240 and the source electrode lead 210 are located, since the blank areas of the region B and the region C are relatively large and require more etchant needs, the etchant in area D and area E is insufficient, resulting in uneven etching of the metal patterns in area D and area E. However, with the above design proposed by the present application, even if the source lead 210 is not etched cleanly such that the end of the source lead 210 protrudes from the first source branch 232, the end of the source lead 210 will not reach and intersect the drain 240 and so the source 230 and the drain 240 will not be short-circuited because the gap between the first source branch 232 and the adjacent drain branch 241 is increased. Which is beneficial to improve the product's production yield.

Figure 7:
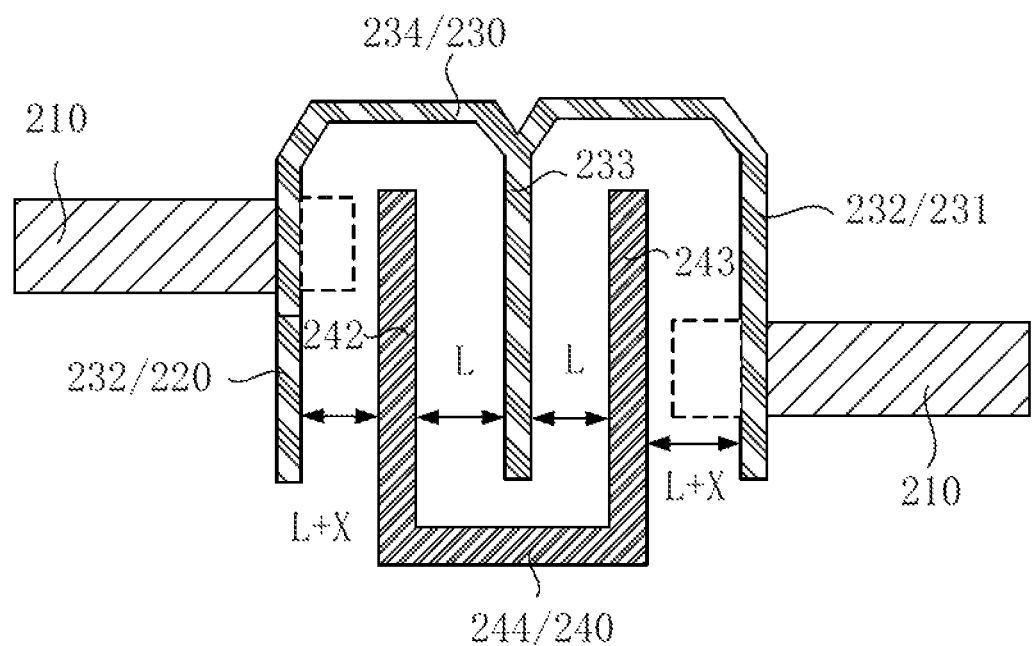
FIG. 7 is a partial schematic diagram of a drive circuit provided by an embodiment of the present application.

As illustrated in FIG. 7, in one embodiment, the thin film transistor 220 needs to be connected to two source leads 210, and in this case, the number of the first source branches 232 is two, and the two first source branches 232 are respectively connected to both ends of the source trunk 234, and the two source leads 210 are respectively connected to the two first source branches 232. The second source branch 233 is arranged in parallel between the two first source branches 232, and is connected to the source trunk 234. Correspondingly, the drain 240 includes a first drain branch 242 and a second drain branch 243 arranged in parallel, and a drain trunk 244 connecting the first drain branch 242 and the second drain branch 243. The first drain branch 242 and the second drain branch 243 are respectively connected to two ends of the drain trunk 244. The first drain branch 242 is disposed between the first source branch 232 and the second source branch 233, and the second drain branch 243 is disposed between the other first source branch 232 and the second source branch 233.

In this embodiment, there is only one second source branch 233, one first drain branch 242 and one second drain branch 243, the source electrode 230 is similar to a W structure, and the drain 240 is similar to a U structure. In this case, the channel width between the first drain branch 242 and the second source branch 233 is equal to the channel width between the second drain branch 243 and the second source branch 233, but both widths are less than the channel width between the first source branch 232 and the first drain branch 242, and are also smaller than the distance between the first source branch 232 and the second drain branch 243. In this embodiment, by increasing the channel width between the outer source branch 231 and the drain branch 241 of the thin film transistor 220, the problem is prevented that the end of the source lead 210 is not etched cleanly due to uneven etching such that the source lead 210 protrudes from the first source branch 232 and reaches and intersects the source 230 and the drain 240, resulting in a short circuit between the source 230 and the drain 240. In addition, in this embodiment, not all channels in the thin film transistor 220 are widened at the same time, so that it will not lead to an increase in the volume of the thin film transistor 220, nor will the increase of the distance between the source electrode 230 and the drain electrode 240 cause the performance of the thin film transistor 220 to deteriorate.

Figure 8:
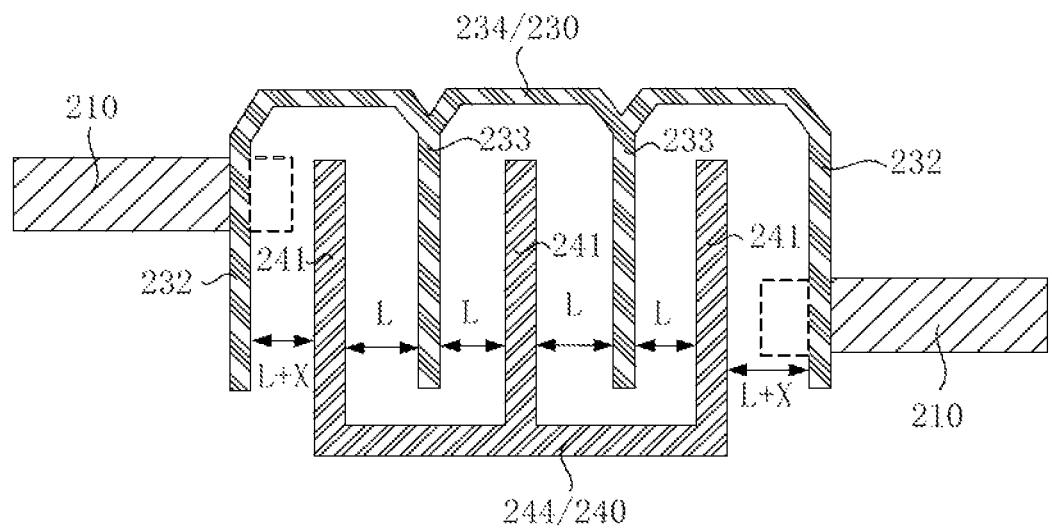
FIG. 8 is a partial schematic diagram of another drive circuit provided by an embodiment of the present application.

Of course, this embodiment is also applicable to more complex thin film transistor 220 structures. As illustrated in FIG. 8, there is shown another type of thin film transistor 220. The source electrode 230 of the thin film transistor 220 includes at least two second source branches 233, and the drain electrode 240 of the thin film transistor includes at least two drain branches 241. In this case, the thin film transistor 220 contains more than four channels, but the widths of the other channels are equal except that the two outermost channels have wider widths.

Figure 9:
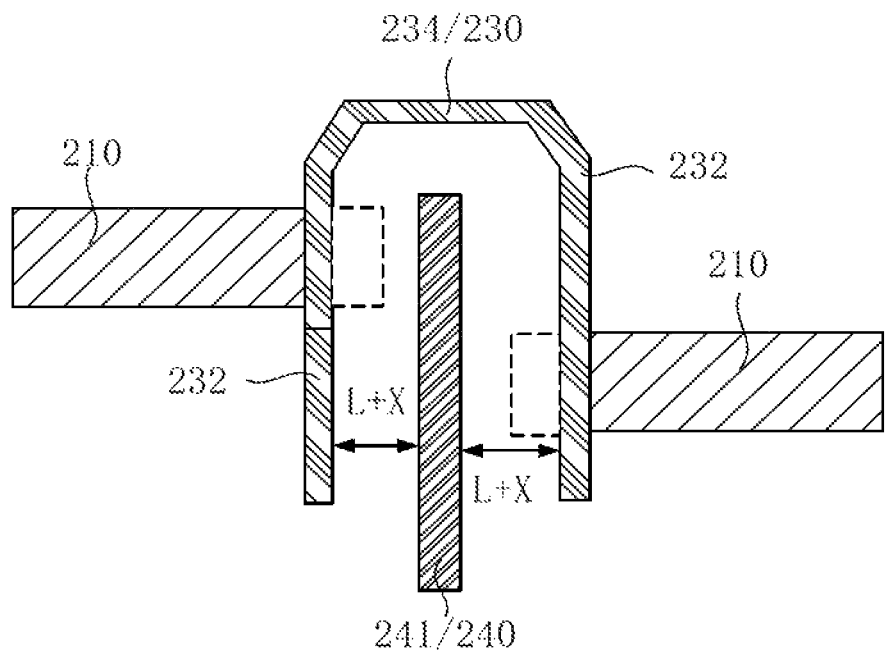
FIG. 9 is a partial schematic diagram of a drive circuit provided by yet another embodiment of the present application.

As illustrated in FIG. 9, in another embodiment, the source electrode 230 of the thin film transistor 220 does not include the second source branch 233; that is, the source electrode 230 has only two first source branches 232 and one source trunk 234, and so the source electrode 230 is U-shaped. In this case, the drain 240 has only one drain branch 241, and there are only two channels in the thin film transistor 220. In this embodiment, on the basis of the existing channel width, the width of the channel is increased to prevent the problem of uneven etching when the metal layer where the source electrode 230, the drain electrode 240 and the source lead 210 are located is etched. That is, due to the small width of the channel, the source lead 210 easily extends into the channel to connect with the drain branch 241, so that the source electrode 230 and the drain electrode 240 are short-circuited.

In the above embodiments, the thin film transistor 220 is connected to two source leads 210 at the same time, and the two source leads 210 are respectively vertically connected to the first source branches 232 on both sides of the thin film transistor 220, and the two source leads 210 is not on the same line. In connection with FIG. 2, in the drive circuit 200, one source lead 210 is closer to the area B, and one source lead 210 is closer to the area C, so that the spaces of the area B and the area C are closer, the uniformity of the etchant distribution is improved, which is conducive to the uniform effect of the metal layer etching in the area D and the area E.

Furthermore, in this embodiment, the thin film transistor 220 is located between the region B and the region C, and its channel width is larger than the channel widths of the thin film transistor in other positions in the gate drive unit 270, more particularly larger than the channel width of the thin film between the region A and the region B.

In the embodiments portrayed in FIGS. 7 to 9, one thin film transistor 220 is connected to two source leads 210 at the same time, and their difference lies in the different types of thin film transistors 220. In the subsequent embodiments, however, one thin film transistor 220 is connected to one source lead 210, and the difference also lies in that the types of thin film transistors 220 are different. The drive circuits 200 in these different embodiments can be combined and matched depending on different usage environments and usage requirements, so that the drive circuit 200 is less prone to short-circuit problems while satisfying the requirement of small occupied space.

Figure 10:
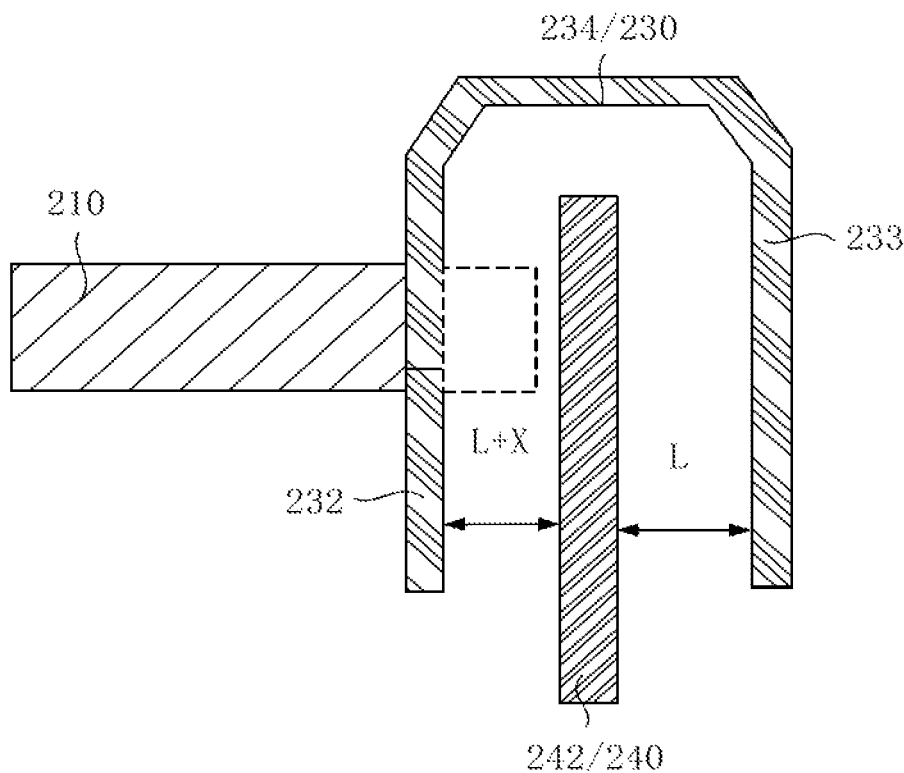
FIG. 10 is a partial schematic diagram of a drive circuit with only one source lead provided by yet another embodiment of the present application.

As illustrated in FIG. 10, as another embodiment of the present application, the thin film transistor 220 is only connected to one source lead 210. The thin film transistor 220 includes a source electrode 230 and a drain electrode 240. The source electrode 230 includes a first source branch 232 and a second source branch 233 arranged in parallel, and the first source branch 232 and the second source branch 233 are respectively connected to two ends of the source trunk 234. The source electrode 230 is U-shaped, and the source lead 210 is connected to the first source branch 232. The drain 240 includes a first drain branch 242 disposed between the first source branch 232 and the second source branch 233 and respectively form two channels with the first source branch 232 and the second source branch 233. The channel width between the first source branch 232 and the first drain branch 242 is greater than the channel width between the second source branch 233 and the first drain branch 242.

This embodiment is aimed at the case where the thin film transistor 220 is connected to only one source lead 210. By increasing the channel width adjacent to the source lead 210, the safety performance of the thin film transistor 220 is improved, the situation is avoided where the source lead 210 is connected to the drain 240 when the etching is uneven such that the source 230 and the drain 240 are short-circuited. Of course, on the basis of this embodiment, the number of channels can also be increased; that is, the number of the second source branches 233 can be increased to two or more, and one or more second drain branches 243 can be added, so that the performance of the thin film transistor 220 is improved.

Further, in the above embodiment, the channel width between the first source branch 232 and the adjacent drain branch 241 is 1.1-1.2 times the channel width between the second source branch 233 and the adjacent drain branch 241. That is to say, let the channel width between the second source branch 233 and the adjacent drain branch 241 be L, and the channel width between the first source branch 232 and the adjacent drain branch 241 be L+X, then X is 0.1-0.2 times L. Further, the channel width between the second source branch 233 and the adjacent drain branch 241 is 3 um-7 um, and the channel width between the first source branch 232 and the adjacent drain branch 241 is 3.1 um-7.5 um.

When etching the metal film layer where the source and drain electrodes are located, it is needed to first lay a metal layer on the surface of the entire array substrate, then form a photoresist on the metal layer, and then use a mask to illuminate the photoresist to form a photoresist pattern. The metal film layer is etched by means of the photoresist pattern to form scanning lines in the display area and gate drive circuits in the non-display area of the array substrate. The minimum gap of a typical half-tone mask in the gate driver circuit of the array substrate is 5.5 um, and the minimum gap in the display area is 5.7 um. In contrast, the minimum gap of a single slit mask (SSM) in the GOA area is 2.1 um, and the minimum gap in the display area is 2.2 um.

Since the thickness of the mask needs to be reduced by 400-800 A for every compensation of 0.1 um of mask gap, it can be compensated with respect to different phenomena. In the present application, the width compensation is performed on the regions D and E, where the drive circuit is prone to short circuit, to increase the widths of the outer channels of the thin film transistor, namely to increase the distance between the first source branch 232 and the adjacent drain branch. Due to the limitations of the process, the inventor has found through many experiments that when the exposure amount in the region D and the region E is increased by 1-5 MJ, the thickness of the mask is reduced by 800-2000 A, the channel width between the first source branch 232 and the adjacent drain branch is increased by 0.1 um-0.5 um, and the original channel width is supplemented by 0.1 times. As such, the short-circuit problem in area D and area E can be effectively overcome, the yield of GOA is greatly improved, and the energy consumed in the process of exposure and development is not high, which is beneficial to production.

In this application, all source branches 231 and drain branches 241 are strip-shaped structures, which can be rectangular, oval or other shapes. The extension direction of the source branch 231 and the extension direction of the source trunk 234 are perpendicular to each other, and the extension direction of the drain branch 241 and the extension direction of the drain trunk 244 are also perpendicular to each other. However, the extension direction of the source branch 231 and the extension direction of the source trunk 234 may form an acute angle, and the extension direction of the drain branch 241 and the extension direction of the drain trunk 244 may also form an acute angle. Moreover, the widths of the source branches 231, the source trunk 234, the drain branches 241 and the drain trunk 244 are all equal, and the channel widths between the second source branches 233 and the adjacent drain branches 241 are also equal, thereby increasing the conductivity of the thin film transistor 220.

In addition, the present application can improve the charging efficiency of the thin film transistor 220 by widening the width of the source lead 210. According to the resistance formula, under the condition that the material and length of the source lead 210 do not change, the resistance of the entire source lead 210 can be reduced by increasing the width of the source lead 210. Since the width of the source lead 210 is increased, in the case of uneven etching, the area of the portion of the source lead 210 protruding from the first source branch 232 may be larger. However, since the present application has widened the channel width between the first source branch 232 and the drain branch 241, even if the width of the source lead 210 is widened, it is not easy to cause the source lead 210 to be connected to the drain 240. Therefore, under the condition of improving the charging efficiency of the thin film transistor 220 in the present application, even if the problem of uneven etching occurs, the source and drain electrodes 230 and 240 will not be short-circuited. In particular, the maximum width of the source lead 210 can be the same as the length of the first source branch 232, so that the source lead 210 can cover the first source branch 232.

Figure 11:
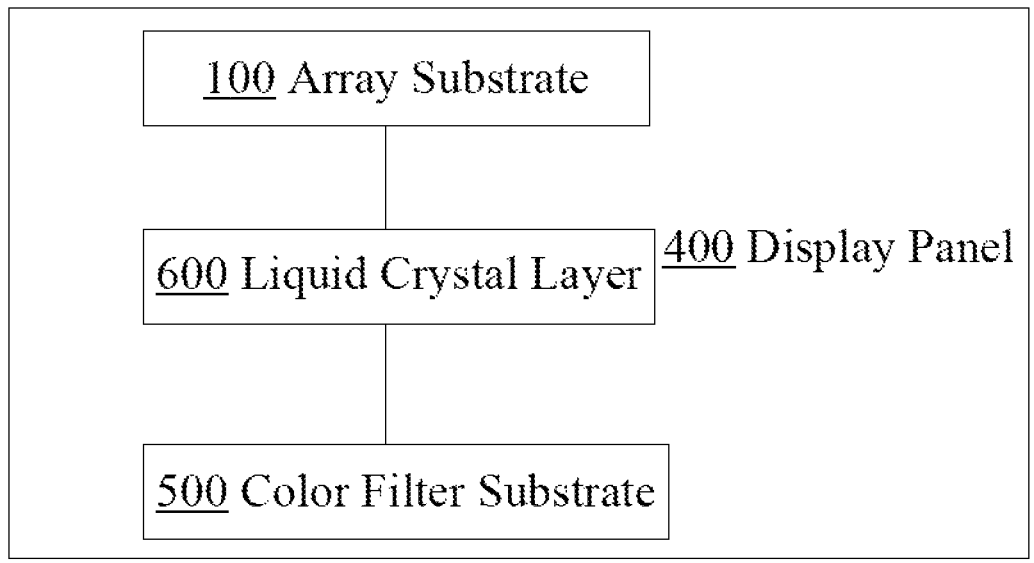
FIG. 11 is a schematic diagram of a display panel according to an embodiment of the present application.

FIG. 11 shows a schematic diagram of a display panel. As another embodiment of the present application, a display panel 400 is further disclosed. The display panel 400 includes the array substrate 100 illustrated in FIG. 1, a color filter substrate 500 disposed opposite to the array substrate 100, and a liquid crystal layer 600 disposed between the array substrate 100 and the color filter substrate 500. The non-display area of the array substrate 100 includes the above-mentioned drive circuit 200. In addition, the thin film transistor 220 in any embodiment of the present application is not only applicable to the control switches of the drive circuit 200 in the non-display area, but also applicable to the active switches in the display area of the array substrate 100.

The technical solutions of the present application may be widely used in various display panels, such as TN (Twisted Nematic) display panels, IPS (In-Plane Switching) display panels, VA (Vertical Alignment) display panels, and MVA (Multi-Domain Vertical Alignment) display panels. Of course, the above solutions are also applicable to other types of display panels.

It should be noted that the inventive concept of the present application can form a large number of embodiments, but they cannot be enumerated because the length of the application document is limited. The technical features as set forth herein can be arbitrarily combined to form a new embodiment, and the original technical effects may be enhanced after various embodiments or technical features are combined.

The foregoing is a further detailed description of the present application in conjunction with specific optional embodiments, but it should not be construed as that the specific implementation of the present application will be limited to these descriptions. For those having ordinary skill in the technical field of the present application, without departing from the scope and spirit of the present application, some simple deductions or substitutions can be made, which should all be regarded as falling in the scope of protection of the present application.

What is claimed is:

1. A control switch of a drive circuit, the control switch comprising a thin film transistor, the drive circuit further comprising a source lead connected to the thin film transistor, the thin film transistor comprising:
    a source electrode, comprising at least two source branches that are arranged in parallel, and a source trunk connecting the at least two source branches together;
    a drain electrode, disposed in a same layer as the source electrode, and comprising at least one drain branch and a drain trunk connecting the at least one drain branch together, wherein the at least one drain branch and the at least two source branches are arranged in parallel and alternately to form a plurality of channels; and
    a gate electrode, arranged corresponding to the source electrode and the drain electrode;
    wherein each source branch directly connected to the source lead is a first source branch, and each source branch not directly connected to the source lead is a second source branch; wherein a channel width between the first source branch and a respective drain branch adjacent to the first source branch is greater than a channel width between the second source branch and a respective drain branch adjacent to the second source branch.

2. The control switch as recited in claim 1, wherein the first source branches are provided in the number of two, and the two first source branches are respectively connected to two ends of the source trunk, and wherein two source leads are respectively connected to the two first source branches; the second source branch is arranged in parallel between the two first source branches and is connected to the source trunk;
    wherein of the at least one drain branch, the drain branches respectively connected to two ends of the drain trunk are respectively a first drain branch and a second drain branch, wherein the first drain branch is arranged between the first source branch and the second source branch, and the second drain branch is disposed between the other first source branch and the second source branch.

3. The control switch as recited in claim 2, wherein there is provided only one second source branch, one first drain branch, and one second drain branch, and wherein the source electrode is a W-shaped structure, and the drain electrode is a U-shaped structure.

4. The control switch as recited in claim 3, wherein the channel width between the first drain branch and the second source branch is equal to the channel width between the second drain branch and the second source branch, and is smaller than the channel width between the respective first source branch and the first drain branch and smaller than the channel width between the respective first source branch and the second drain branch.

5. The control switch as recited in claim 1, wherein the source electrode has only two first source branches and one source trunk, and the source electrode is U-shaped, and wherein the drain electrode has only one drain branch.

6. The control switch as recited in claim 2, wherein the number of the second source branches is at least two, and wherein of the drain branches, a third drain branch is connected to a region of the drain trunk between both ends of the drain trunk and is arranged in parallel between the first drain branch and the second drain branch, and wherein the third drain branch is also arranged between two adjacent second source branches.

7. The control switch as recited in claim 2, wherein the source lead is vertically connected to each of the two first source branches, and wherein the two source leads are not on the same straight line.

8. The control switch as recited in claim 1, wherein the number of the first source branch is one, the first source branch is connected to one end of the source trunk, and one second source branch is connected to the other end of the source trunk;

and wherein the drain branch is disposed between the first source branch and the second source branch.

9. The control switch as recited in claim 8, wherein the number of the second source branches is at least two, and wherein of the drain branches, the drain branches respectively connected to both ends of the drain trunk are respectively a first drain branch and a second drain branch, and wherein a third drain branch is connected to the region of the drain trunk between the two ends of the drain trunk;

wherein the first drain branch is disposed between the adjacent first source branch and second source branch, and wherein the second drain branch and the third drain branch are each disposed between two adjacent second source branches.

10. The control switch as recited in claim 1, wherein the channel width between the first source branch and the adjacent drain branch is 1.1-1.2 times the channel width between the second source branch and the adjacent drain branch.

11. The control switch as recited in claim 10, wherein the channel width between the second source branch and the adjacent drain branch is 3 um-7 um, and the channel width between the first source branch and the adjacent drain branch lies in the range of 3.1 um-7.5 um.

12. The control switch as recited in claim 1, wherein the at least two source branches and the at least one drain branch each have a strip, a rectangle or an ellipse shape.

13. The control switch as recited in claim 1, wherein an extension direction of the at least two source branches and an extension direction of the source trunk are perpendicular to each other, and wherein an extension direction of the at least one drain branch and an extension of the drain trunk are perpendicular to each other.

14. The control switch as recited in claim 1, wherein an extension direction of the at least two source branches and an extension direction of the source trunk form an acute angle, and wherein an extension direction of the at least one drain branch and an extension direction of the drain trunk form an acute angle.

15. The control switch as recited in claim 1, wherein the at least two source branches, the source trunk, the at least one drain branch, and the drain trunk are all equal in width.

16. The control switch as recited in claim 1, wherein channel widths between every two adjacent second source branch and drain branch are equal.

17. An array substrate, comprising a drive circuit, a source lead and a scan line driven by the drive circuit; the drive circuit comprising a control switch, which comprises a thin film transistor connected to the source lead; wherein the thin film transistor comprises a source electrode, a drain electrode and a gate electrode; the source electrode comprises at least two source branches arranged in parallel, and a source trunk connecting the at least two source branches together; the drain electrode is arranged in a same layer as the source electrode, and comprises at least one drain branch, and a drain trunk connecting the at least one drain branch; the at least one drain branch and the at least two source branches are arranged in parallel and alternately to form channels, and the gate electrode is arranged corresponding to the source and drain; wherein each source branch directly connected to the source lead is a first source branch, and each source branch not directly connected to the source lead is a second source branch; wherein a channel width between the first source branch and the respective drain branch adjacent to the first source branch is greater than a channel width between the second source branch and the respective drain branch adjacent to the second source branch.

18. The array substrate as recited in claim 17, wherein the drive circuit comprises a frame start signal line, a gate voltage control line, a clock signal line, and a plurality of gate drive units, wherein input ends of the gate drive unit are respectively connected to the frame start signal line, the gate voltage control line, and the clock signal line, and an output end of the gate drive unit is connected to the scan line to drive the scan line; the gate voltage control line is connected to a thin film transistor in the gate drive unit through the source lead.

19. The array substrate of claim 18, wherein the gate drive unit comprises a first thin film transistor, a second thin film transistor, a third thin film transistor, and a fourth thin film transistor; a source electrode of the first thin film transistor is respectively connected to the gate voltage control line and a source electrode of the second thin film transistor through two source leads, respectively, and a drain electrode of the first thin film transistor is connected to a source electrode of the third thin film transistor and to a gate electrode of the fourth thin film transistor, and a gate electrode of the first thin film transistor is connected to a gate electrode of the second thin film transistor; a drain electrode of the second thin film transistor is connected to a source electrode of the fourth thin film transistor, and a gate electrode of the second thin film transistor is connected to a gate electrode of the fourth thin film transistor; a drain electrode of the third thin film transistor is connected to the frame start signal line, and a drain electrode of the fourth thin film transistor is connected to the clock signal line.

20. A display panel comprising an array substrate, a color filter substrate disposed opposite to the array substrate, and a liquid crystal layer disposed between the array substrate and the color filter substrate; the array substrate comprises a drive circuit, a source lead, and a scan line driven by the drive circuit; the drive circuit comprises a control switch, which comprises a thin film transistor connected to the source lead; wherein the thin film transistor comprises a source electrode, a drain electrode and a gate electrode; the source electrode comprises at least two source branches arranged in parallel, and a source trunk connecting the at least two source branches together; the drain electrode is arranged in a same layer as the source electrode, and comprises at least one drain branch, and a drain trunk connecting the at least one drain branch together; the at least one drain branch and the at least two source branches are arranged in parallel and alternately to form channels, and the gate electrode is arranged corresponding to the source and drain; wherein each source branch directly connected to the source lead is a first source branch, and each source branch not directly connected to the source lead is a second source branch; wherein a channel width between the first source branch and the respective drain branch adjacent to the first source branch is greater than a channel width between the second source branch and the respective drain branch adjacent to the second source branch.

* * * * *